United States Patent [19]

Mostafazadeh et al.

[11] Patent Number: 5,650,659
[45] Date of Patent: Jul. 22, 1997

[54] SEMICONDUCTOR COMPONENT PACKAGE ASSEMBLY INCLUDING AN INTEGRAL RF/EMI SHIELD

[75] Inventors: Shahram Mostafazadeh; Satya Chillara, both of San Jose; Jagdish Belani, Cupertino, all of Calif.

[73] Assignee: National Semiconductor Corporation, Santa Clara, Calif.

[21] Appl. No.: 511,391

[22] Filed: Aug. 4, 1995

[51] Int. Cl.⁶ .................................................. H01L 23/552
[52] U.S. Cl. ............................ 257/660; 252/659; 252/787
[58] Field of Search ............................... 257/659, 660, 257/787

[56] References Cited

U.S. PATENT DOCUMENTS

| 4,680,617 | 7/1987 | Ross | 257/668 |
| 5,151,769 | 9/1992 | Immorlica, Jr. et al. | 257/659 |
| 5,406,117 | 4/1995 | Dlugokecki et al. | 257/660 |

FOREIGN PATENT DOCUMENTS

| 61-252652 | 11/1986 | Japan | 257/659 |
| 1-138739 | 5/1989 | Japan | 257/659 |
| 5-95055 | 4/1993 | Japan | 257/659 |

OTHER PUBLICATIONS

MOS/LSI plastic package for 20 cents, Electronics, Dec. 6, 1971, p. 40.

*Primary Examiner*—Mahshid D. Saadat
*Assistant Examiner*—T. M. Arroyo
*Attorney, Agent, or Firm*—Hickman Beyer & Weaver

[57] ABSTRACT

A semiconductor component package assembly including an integral radio frequency and electromagnetic interference shield is disclosed herein. The assembly includes a support member which supports an IC chip and defines an array of conductive leads. An electrically conductive shield is positioned relative to the IC chip so as to form an integral RF/EMI barrier between the IC chip and the ambient surroundings of the overall assembly. In a preferred embodiment, the shield is formed from different layers of material and configured for electrical connection of at least one conductive layer to certain ones of the leads which may include one or more ground leads. In a method of the invention, a shield is provided which is thereafter fixedly attached to an intermediate assembly including an IC chip to form an integral RF/EMI shield between the chip and the the ambient environment 14 Claims, 5 Drawing Sheets 5,650,659

SEMICONDUCTOR COMPONENT PACKAGE ASSEMBLY INCLUDING AN INTEGRAL RF/EMI SHIELD

BACKGROUND OF THE INVENTION

The present invention relates generally to a semiconductor component package assembly and more particularly to a semiconductor component package assembly including an integral radio frequency (RF) and electromagnetic interference (EMI) shield and its method of manufacture.

A typical integrated circuit package is comprised of (1) an IC chip including an array of chip input/output terminals, (2) means for supporting the chip, for example, either a lead-frame or substrate, including an array of electrically conductive leads, (3) bonding wires electrically connecting the chip input/output terminals with respective ones of the electrically conductive leads, and (4) plastic material encapsulating the IC chip, support means and bonding wires. This overall package is typically manufactured by first supporting the IC chip on the support member. The bonding wires are then attached to electrically interconnect the input/output terminals of the IC chip to the electrically conductive leads of the support member. This subassembly is then placed in a cooperating mold to encapsulate the IC chip, support means and bonding wires in plastic.

Attention is now directed to FIG. 1, which diagrammatically illustrates an intermediate step in the production of a prior art IC package of the type described immediately above. An intermediate IC assembly, which is generally indicated by the reference numeral 10 is shown prepared for overall encapsulation. Intermediate IC assembly 10 includes an IC chip 12 including an array of chip input/output terminals 13. Chip 12 is supported on a suitable support member 14 which can be, for example, a leadframe or a dielectric substrate. The support member includes an array of electrically conductive leads 16 electrically connected to respective chip input/output terminals by an array of bonding wires 18.

Still referring to FIG. 1, a mold for use in encapsulating intermediate IC assembly 10 is generally indicated by the reference numeral 20. Mold 20 includes a runner 22 which leads from an external supply of molding material (not shown) to a mold cavity 24 for accommodating a flow of molding material 26 into mold cavity 24. A fixed gate 28 is located in runner 22 at the point where the runner enters mold cavity 26. Intermediate IC assembly 10 is supported within mold cavity 24 for overall encapsulation by the molding material. As the molding material is injected into the cavity it flows around the intermediate IC assembly including bonding wires 18, IC chip 12 and at least a portion 29 of electrically conductive leads 16 which are within the mold cavity. Bonding wires 18 are generally formed from gold and are quite frail. As molding material 26 is injected, care must be taken so as to avoid the phenomenon of wire sweep in which the bonding wires are easily disconnected or shorted together by the inflowing molding material. Following the injection of the molding material into the mold cavity, the mold material is allowed to harden whereby to form a monolithic encapsulation structure.

While the method of producing a prior art integrated circuit package, as depicted in FIG. 1, does produce an IC package which is generally satisfactory for its intended purpose, certain electronic applications such as, for example, high gain RF amplifiers require shielding for electronic components like IC 12 from extraneous electromagnetic and radio frequency noise originating from sources external to the overall component package. In other instances, shielding is required if a particular component generates radio frequency noise or electromagnetic interference at such levels that other components may be deleteriously affected or this noise may, in fact, be produced at levels in violation of, for example, FCC regulations. In the past, shielding has generally been provided in the form of an additional grounded metal enclosure external to any particular individual semiconductor component package, for example shielding an entire functionally related section of a circuit board and surrounding that portion of the latter containing the offending sensitive or noisy electronic component or components. The incorporation of such shielding, however, results in increased production and manufacturing costs and, in some cases, also results in a disadvantageous increase in the size of the overall assembly.

The present invention introduces a highly advantageous semiconductor component package assembly and its associated method of manufacture which incorporates RF/EMI shielding within a package which is no larger than functionally identical unshielded prior art packages whereby to eliminate the need for a separate grounded metal enclosure.

SUMMARY OF THE INVENTION

As will be described in more detail hereinafter, there is disclosed herein a semiconductor component package assembly and its method of manufacture. This package, like the package illustrated in FIG. 1, includes an IC chip having an array of chip input/output terminals, a support member having an array of electrically conductive leads and supporting the IC chip and an array of bonding wires electrically connecting the chip input/output terminals with respective ones of the electrically conductive leads. However, in accordance with the present invention, the overall semiconductor component package assembly includes an electrically conductive shield positioned relative to the IC chip so as to form an electromagnetic and radio frequency interference barrier between the IC chip and the ambient surroundings of the overall assembly such that components which are sensitive to such interference may be shielded from externally originating interference or components which emit interference may be housed within the component assembly whereby to avoid adversely affecting other associated circuitry. In a preferred embodiment, the bonding wires are directly supported at least in part by a dielectric material.

In the manufacture of a semiconductor component assembly which includes a support member having an array of electrically conductive leads, an IC chip having an array of chip input/output terminals and an array of bonding wires, a method of forming an electromagnetic and radio frequency shield between the IC chip and the ambient environment of the overall assembly is disclosed. The IC chip is supported on the support member and the bonding wires electrically interconnect the conductive leads with respective ones of the chip input/output terminals so as to form an intermediate assembly. An electrically conductive shield is provided which when positioned adjacent the IC chip in a predetermined way serves as an electromagnetic and radio frequency barrier between the chip and the ambient environment of the overall component assembly. The shield is thereafter fixedly attached to the intermediate assembly such that it is positioned as described to function as an RF/EMI barrier.

BRIEF DESCRIPTION OF THE DRAWINGS

The present invention may be understood by reference to the following detailed description taken in conjunction with the drawings, in which.

DETAILED DESCRIPTION OF THE INVENTION

Figure 1:
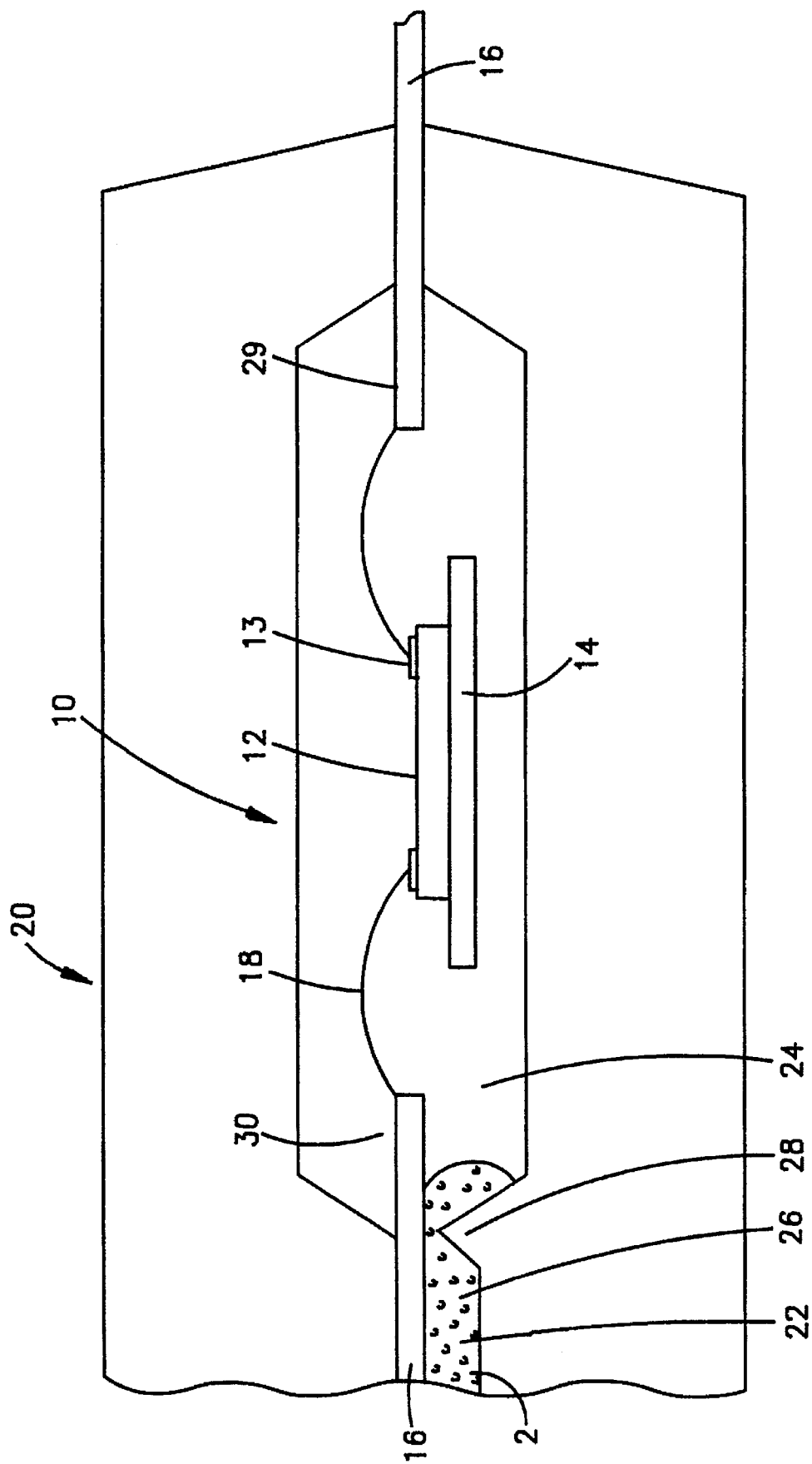
FIG. 1 is a cross-sectional diagrammatic elevational view which illustrates an intermediate step in the manufacture of a prior art integrated circuit assembly.
Figure 2:
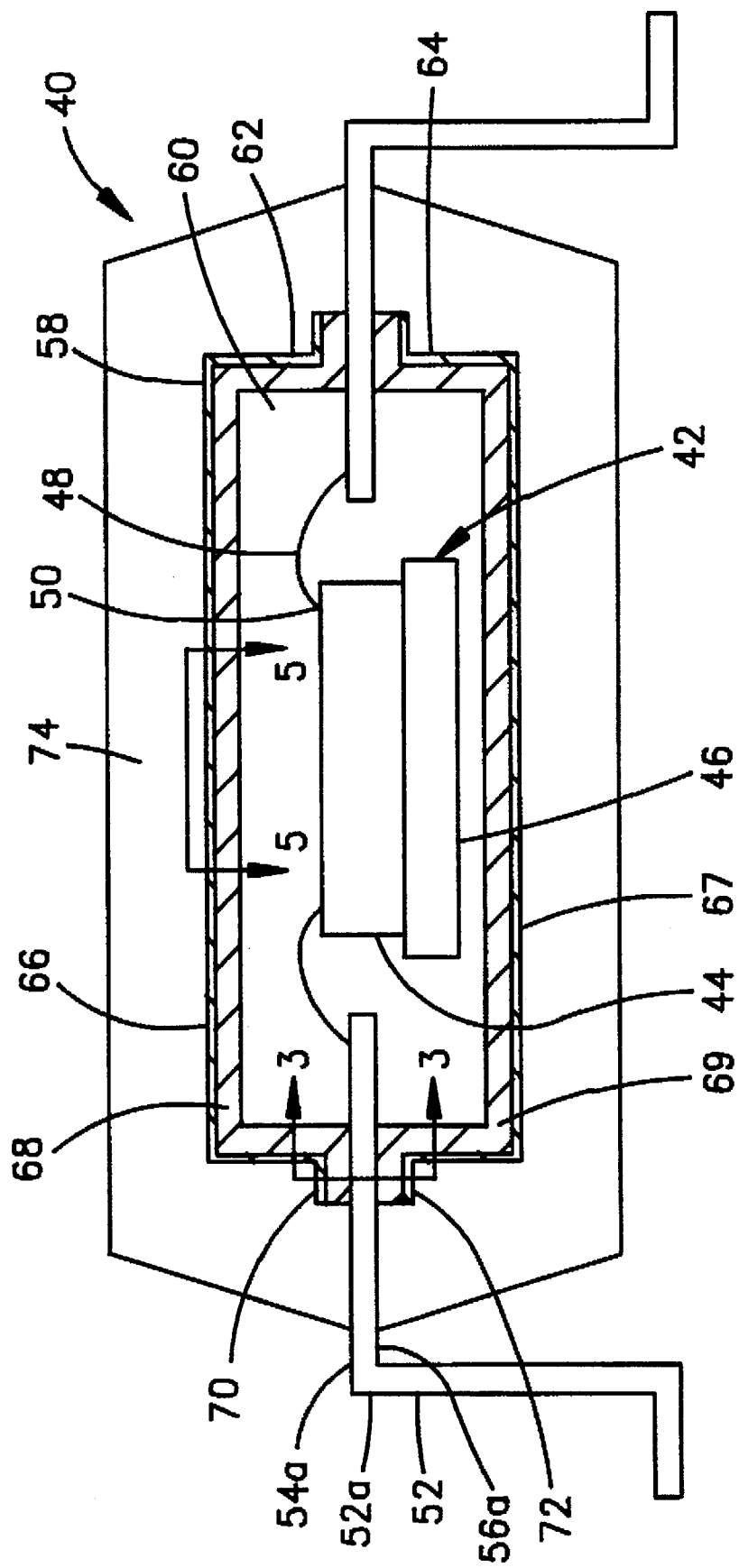
FIG. 2 is a cross-sectional diagrammatic elevational view which illustrates the semiconductor component package assembly of the present invention showing the arrangement of an integral radio frequency and electromagnetic interference shield.
Figure 3:
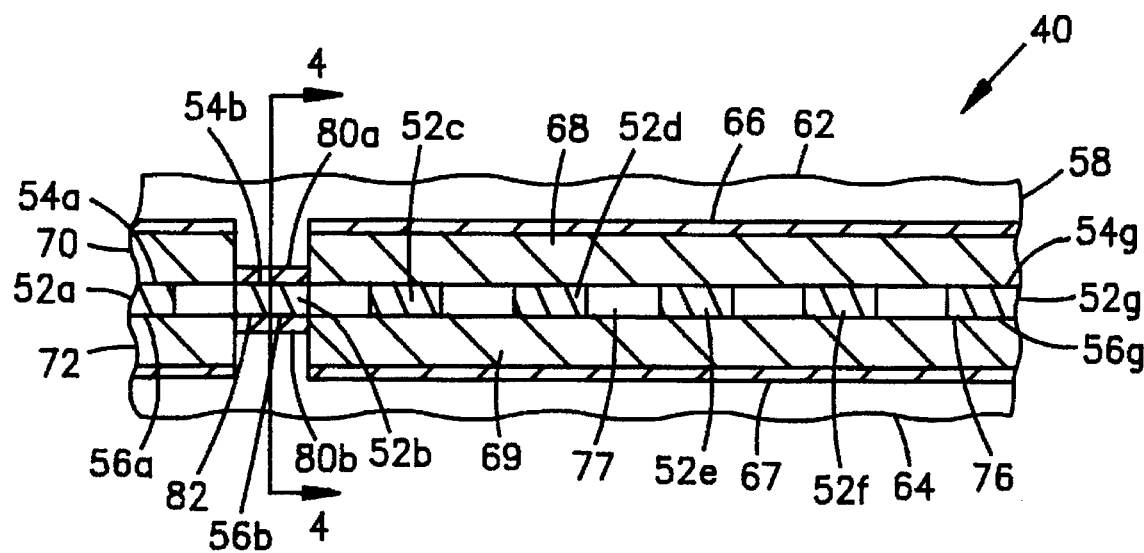
FIG. 3 is a diagrammatic fragmentary cross-sectional view, in elevation, of the semiconductor component package assembly of the present invention taken generally along line 3—3 of FIG. 2 shown here to illustrate details of the integral shield.

Having described FIG. 1 previously, attention is immediately directed to FIGS. 2 and 3, which illustrate a semiconductor component package assembly manufactured in accordance with the present invention and generally designated by reference numeral 40. Package 40 includes an intermediate assembly 42 which itself includes an IC chip 44, a support member 46 supporting the IC chip and an array of bonding wires 48. IC chip 44 includes an array of chip input/output terminals 50 each one of which is connected to a respective one of a plurality of electrically conductive leads of which seven are shown 52a–g. Leads 52 are electrically connected to chip input/output terminals 50 by a respective one of bonding wires 48. Each one of leads 52a–g also includes an upper and a lower surface 54a–g and 56a–g, respectively. Support member 46 may be a leadframe or a substrate, either of which are typical of the support members used in the prior art. It is shown here as a leadframe, actually the die attach pad of a leadframe and leads 52 are leadframe leads. The support member could be a dielectric substrate with leads 52 printed or otherwise provided thereon.

Continuing to refer to FIG. 2 in conjunction with FIG. 3 and in accordance with the present invention, an electrically conductive shield 58 defines a cavity 60 in which IC chip 44, bonding wires 48 and portions of support member 46 including portions of electrically conductive leads 52 are positioned. Shield 58 includes an upper half 62 and a lower half 64. The upper and lower halves each respectively include electrically conductive outer layers 66 and 67, inner substantially rigid dielectric layers 68 and 69 supporting the outer conductive layers and laterally projecting peripheral edge portions 70 and 72. The overall semiconductor component assembly is encapsulated using a suitable packaging material 74 (illustrated as being transparent in certain figures for purposes of clarity) which is generally a plastic provided by injection molding, as will be described hereinafter with regard to the method of the present invention.

Still referring to FIGS. 2 and 3, peripheral edge portion 70 of upper shield half 62 is attached to upper surfaces 54a–g of conductive leads 52 while peripheral edge portion 72 of lower shield half 64 is attached to lower surfaces 56a–g of conductive leads 52. In the present example, the upper surfaces of leads 52a and 52c–g are adhesively bonded to dielectric layer 68 of peripheral edge portion 70 by means which are well known in the art including a suitable material 76 such as, for example, non-conductive epoxy or adhesive tape, although other techniques may also be used. Lower shield half 64 is similiarly attached to lower surfaces 56a and 56c–g of the same leads forming a plurality of passages 77 between the leads and the shield halves. Therefore, electrically conductive layers 66 and 67 of each respective half are selectively electrically isolated from leads 52a and 52c–g.

Figure 4:
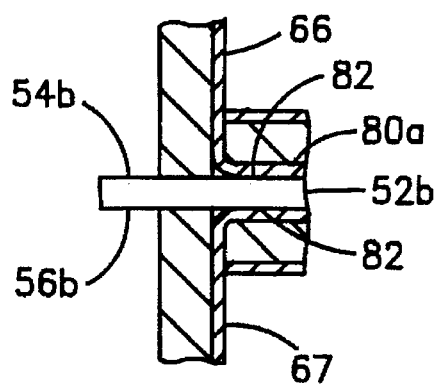
FIG. 4 is a diagrammatic fragmentary cross-sectional view, in elevation, of the semiconductor component assembly of the present invention taken generally along line 4—4 of FIG. 3 shown here to further illustrate details of the integral shield.

Referring now to FIG. 4 in conjunction with FIG. 3, electrically conductive layers 66 and 67 of each shield half are selectively electrically connectable with any of conductive leads 52 within the overall component package. Many different arrangements may be utilized to accomplish this feature, in accordance with the present invention. In the present example, electrical connection of the conductive layers of both the upper and lower shield halves is realized by cooperatively configuring the dielectric and conductive layers of each shield half such that an upper tab portion 80a of the upper shield half is in electrical contact with upper surface 54b of lead 52b and a lower tab portion 80b of the lower shield half is in electrical contact with lower surface 56b of the same lead. Tab portions 80a and 80b are fixedly attached to lead 52b by means well known in the art such as, for example, electrically conductive epoxy 82, although any other suitable electrical contacting technique may be provided within the scope of the present invention. Typically, shielding of electronic components is best provided by electrically connecting the shield to a circuit ground and, since virtually all electronic packages require a grounded lead for their proper operation, one or more of leads 52 will normally comprise a circuit ground which may include a lead such as 52b of the current example. Thus, the conductive layers of upper and lower shield halves 62 and 64, respectively, may be readily grounded. It is also anticipated that the conductive layers could serve other purposes. For example, any number of leads 52 can be electrically connected to one or both of the conductive layers in the manner illustrated. If just one of these leads is electrically connected directly to a circuit ground, the remaining leads connected to that same conductive layer are also grounded by virtue of their common connections to the grounded layer (not shown). In this way, the number of external connections which are provided to an individual semiconductor component assembly may be reduced whereby to simplify the required external electrical circuitry associated with the assembly.

The integral radio frequency and electromagnetic shield of the present invention functions in the same manner as previously devised shields. That is, components within a cavity defined by a shield are essentially immune to RF and EM interference originating external to the shield or, conversely, any offending noisy components may be enclosed within the shield so as effectively contain emissions which would adversely affect other sensitive components. The integral shield of the present invention may be configured in a variety of ways and formed from various materials to function as described. For instance, the outer electrically conductive layer of each shield half may be readily formed from metallic foils such as, for example, plated copper in a stamping operation which is well known in the art, following which a suitable dielectric material such as plastic or adhesive tape is applied to the inner or cavity defining surface of the foil. The shield halves may be molded into their final configurations either before or after the application of the dielectric material to the foil, dependent upon the manufacturing process being used. Typically, the shield halves utilize rather simple straight line geometric shapes in order to simplify the manufacturing process, since the outward appearance of the shield does not affect its functionality, provided only that the overall shield defines a cavity in which the IC chip or other such component is substantially surrounded by the shield. It should also be noted that the shield halves may be formed with any number of different layers of materials within the scope of the present invention. For example, an outermost dielectric layer (not shown) can be applied to one or both of electrically conductive layers 62 and 64. It is also anticipated that additional electrically conductive layers (also not shown) be applied over any added outermost dielectric layers. Such additional electrically conductive layers are also selectively electrically connectable with or isolatable from any of the conductive leads within the component package in the same manner as previously described conductive layers 62 and 64. Other variations in the configuration of shield 58 may also prove to be useful, as will be described immediately hereinafter.

Figure 5:
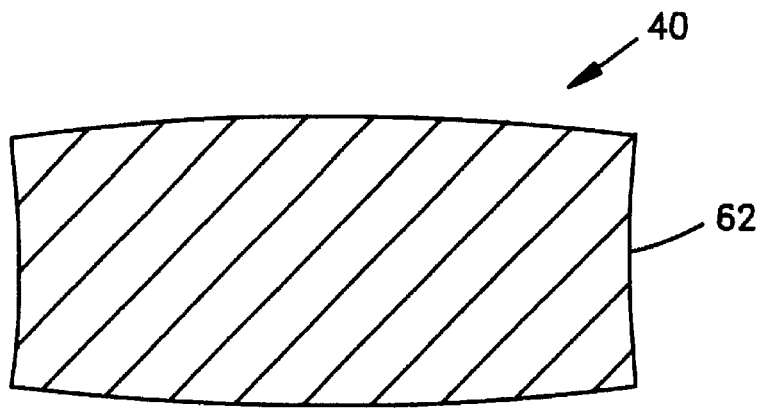
FIG. 5 is a diagrammatic fragmentary plan view of the semiconductor component assembly of the present invention taken generally along line 5—5 of FIG. 2 illustrating details of a first embodiment of an integral shield which is formed from solid material layers.
Figure 6:
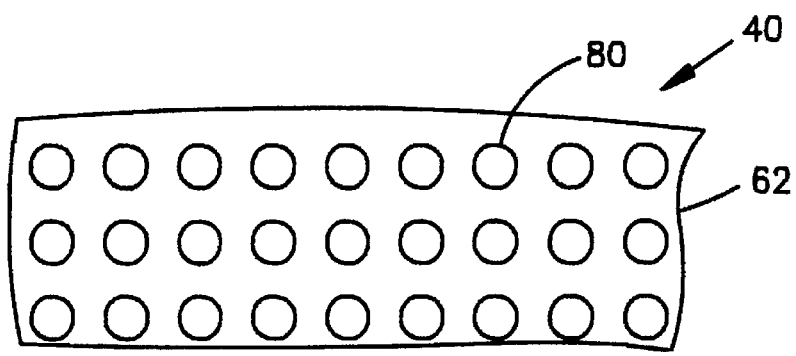
FIG. 6 is a diagrammatic fragmentary plan view of the semiconductor component assembly of the present invention taken generally along line 5—5 of FIG. 2 illustrating details of a second embodiment of an integral shield which defines an array of circular through-holes.
Figure 7:
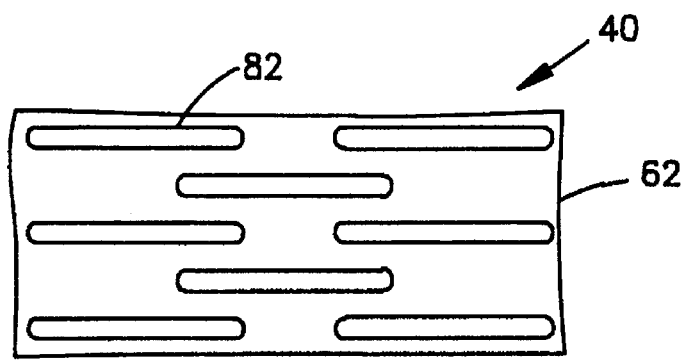
FIG. 7 is a diagrammatic fragmentary plan view of the semiconductor component assembly of the present invention taken generally along line 5—5 of FIG. 2 illustrating details of a third embodiment of an integral shield which defines an array of through-holes in the form of slots.

Turning now to FIGS. 5 through 7, upper and lower shield halves 62 and 64, which form overall shield 58, may be formed including a variety of modifications such as, for example, through-holes. FIG. 5 illustrates a portion of upper shield half 62 wherein the layered material forming the latter comprises a solid sheet. FIG. 6 illustrates a second embodiment wherein upper shield half 62 defines a plurality of through-holes 80 which are circular in cross-section and are arranged in a predetermined pattern. FIG. 7 illustrates yet a third embodiment in which upper shield half 62 defines a plurality of slots 82, also arranged in a predetermined pattern. Generally, lower shield half 64 is configured in the same manner as the upper shield half, although this is not a requirement of the present invention and is not illustrated for purposes of simplicity. The overall pattern and shape of the through-holes may be determined by factors such as operational frequency and the ambient electromagnetic or radio frequency environment in which the component assembly is intended to operate. Based on such factors, the configuration of the shield may include any pattern, shape or arrangement of through-holes.

Figure 8:
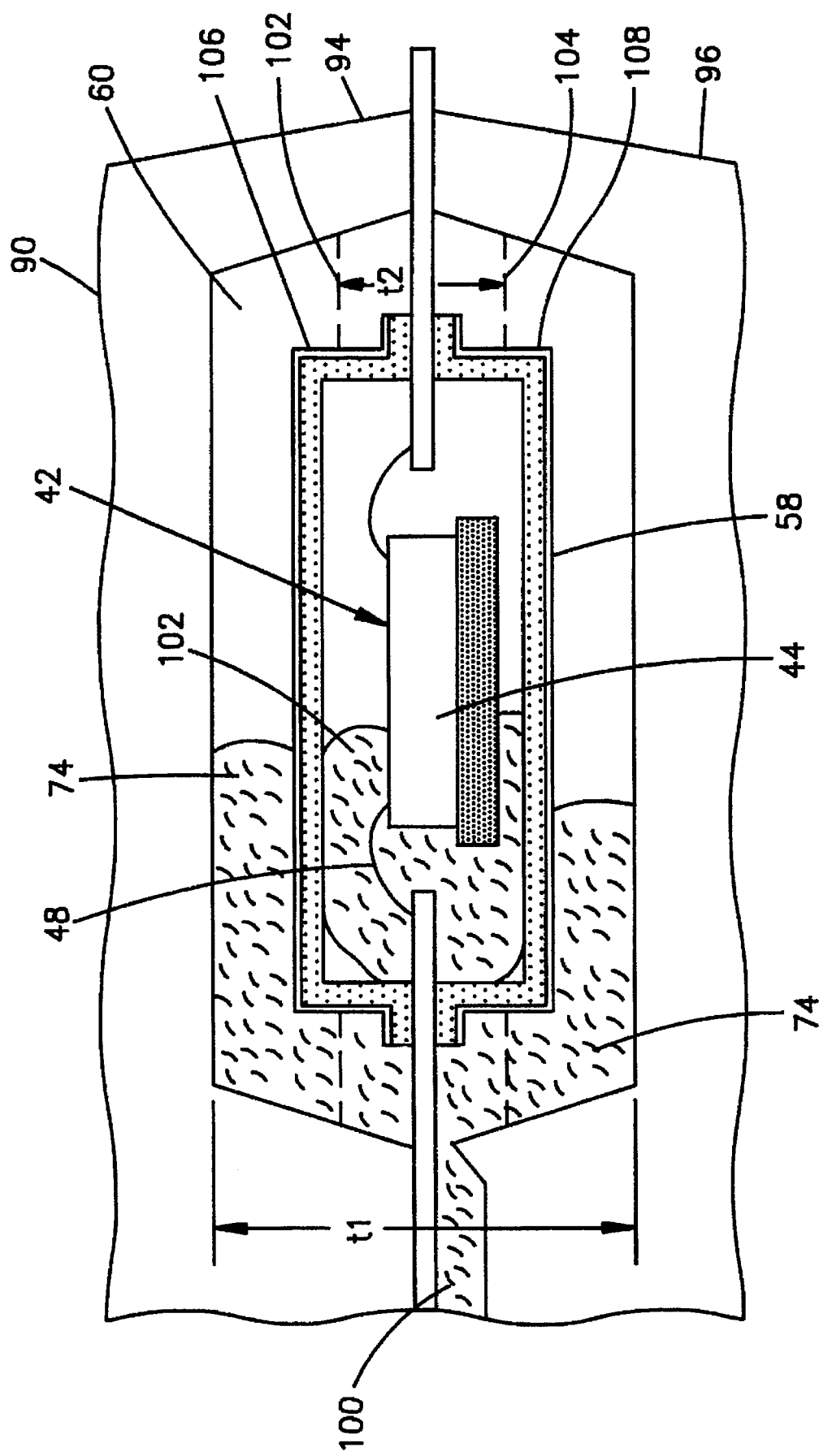
FIG. 8 is a diagrammatic fragmentary cross-sectional view, in elevation, illustrating a mold used in the method of the present invention to encapsulate an intermediate assembly having an integral shield positioned thereon to protect the bonding wires of the intermediate assembly during encapsulation.

FIG. 8 illustrates intermediate assembly 42 of FIG. 2 along with shield 58 positioned in a mold 90 during the step for encapsulating the intermediate assembly with packaging material 74, in accordance with the method of the present invention. Mold 90 includes an upper mold half 94 and a lower mold half 96 cooperatively defining a mold cavity 98 which ultimately defines the outline of the encapsulating packaging material. Packaging material 74 is injected into the mold cavity through a passage 100. As the packaging material is injected, it flows around and surrounds shield 58. Cavity 60, which is defined by the shield so as to house IC chip 44 and bonding wires 48, may also be partially or completely filled by a portion 102 of material 74 which enters the cavity through passages 77 (seen in FIG. 3) and any through-holes (such as those seen in FIGS. 6 and 7) formed in the shield itself depending on controllable factors such as, for example, the viscosity of the packaging material and the geometry of the passages or through-holes. In accordance with the present invention, the bonding wires are thereby directly supported by portion 102 of the packaging material. Additionally, the overall component package produced herein may be produced so as to include a thickness t that is no greater than the thickness of prior art packages which do not incorporate shield 58 such that package assemblies produced in accordance with the present invention can be used in virtually any previous application while providing the advantages described herein.

It should be understood that a semiconductor component package assembly incorporating the integral radio frequency and electromagnetic shield of the present invention may be embodied in many other specific forms and produced by other methods without departing from the spirit or scope of the present invention. For example, mold 90, as illustrated in FIG. 8, may be configured so as to only partially encapsulate shield 58 by defining cavity 60 such that only those portions of the shield and intermediate assembly 42 which lie between dashed lines 102 and 104 are encapsulated to a thickness 12 whereby to leave portions 106 and 108 of the upper and lower shield halves exposed to the ambient surroundings once the component assembly is removed from the mold. In this way the thickness of the assembly is still further reduced. In other embodiments (not shown), the assembly may be produced with no encapsulant material or with an encapsulant material contained only within the cavity defined by the shield. Therefore, the present examples are to be considered as illustrative and not restrictive, and the invention is not to be limited to the details given herein, but may be modified within the scope of the appended claims.

What is claimed is:

1. A semiconductor component assembly comprising:

a) an IC chip including an array of chip input/output terminals;

b) a support member including an array of electrically conductive leads which are provided for connection with the input/output terminals of said IC chip, said support member supporting said IC chip including its array of chip input/output terminals;

c) means for electrically connecting said chip input/output terminals with respective ones of said electrically conductive leads; and d) a shield including at least one substantially rigid dielectric layer supporting at least one electrically conductive layer, said electrically conductive layer being metallic foil, said dielectric layer electrically isolating certain ones of said electrically conductive leads from said electrically conductive layer, said shield being positioned relative to said IC chip so as to form an electromagnetic and radio frequency interference barrier between the IC chip and the ambient surroundings of the overall assembly; and e) a packaging material at least partially encapsulating said IC chip, said connecting means, portions of said support member including portions of said electrically conductive leads and said shield such that the shield protects said bonding wires from wire sweep caused by injection of said packaging material.

2. A semiconductor component assembly in accordance with claim 1 wherein said bonding wires are directly supported by said packaging material.

3. A semiconductor component assembly in accordance with claim 1 wherein said shield is completely surrounded by said packaging material.

4. A semiconductor component assembly in accordance with claim 1 wherein said rigid dielectric material is a plastic.

5. A semiconductor component assembly in accordance with claim 1 wherein said shield is electrically connected to at least one of said electrically conductive leads which is, in turn, grounded.

6. A semiconductor component assembly in accordance with claim 1 wherein each of said electrically conductive leads includes an upper surface and a lower surface and wherein said shield includes an upper half attached to the upper surfaces of certain ones of said leads and a lower half attached to the lower surfaces of certain ones of said leads, said upper and lower halves cooperatively defining a cavity within which said IC chip is positioned.

7. A semiconductor component assembly in accordance with claim 6 wherein each of said halves is formed from one or more layers of solid material.

8. A semiconductor component assembly in accordance with claim 6 wherein each of said halves is integrally formed so as to include a plurality of through-holes arranged in a predetermined configuration and wherein a portion of said packaging material is disposed within the shield, around said IC chip and around said bonding wires, as a result of flowing through said through-holes.

9. A semiconductor component assembly in accordance with claim 8 wherein said through-holes are elongated slots.

10. A semiconductor component assembly in accordance with claim 8 wherein said through-holes are circular.

11. A semiconductor component assembly in accordance with claim 6 wherein said upper and lower halves each include an outer electrically conductive layer serving as said at least one electrically conductive layer and an inner dielectric layer serving as said at least one substantially rigid dielectric layer whereby to support the outer layer.

12. A semiconductor component assembly in accordance with claim 11 wherein said upper and lower halves each include a laterally projecting peripheral edge portion for use in attaching each halve to the respective upper and lower surfaces of said leads.

13. A semiconductor component assembly in accordance with claim 12 wherein said edge portions of the upper and lower halves are each configured for electrical connection of said outer electrically conductive layer to one or more grounded ones of said leads while said inner layer insulates other ones of said leads from said electrically conductive layer whereby to provide a grounded shield substantially surrounding said IC chip.

14. A semiconductor component assembly in accordance with claim 1 wherein said shield includes a series of through-holes and wherein a portion of said packaging material is disposed within the shield, around said IC chip and around said bonding wires, as a result of flowing through said through-holes.

* * * * *